(12) United States Patent
Wald et al.

(10) Patent No.: US 8,730,677 B2
(45) Date of Patent: May 20, 2014

(54) METHOD OF COOLING ELECTRONIC CIRCUIT BOARDS USING SURFACE MOUNTED DEVICES

(75) Inventors: Toni Wald, Kaltennordheim (DE); Sven Liborius, Suhl (DE)

(73) Assignee: Adva Optical Networking SE, Meiningen (DE)

( * ) Notice: Subject to any disclaimer, the term of this patent is extended or adjusted under 35 U.S.C. 154(b) by 226 days.

(21) Appl. No.: 13/324,770

(22) Filed: Dec. 13, 2011

(65) Prior Publication Data

US 2013/0141873 A1 Jun. 6, 2013

(30) Foreign Application Priority Data

Dec. 2, 2011 (EP) .................................... 11401654

(51) Int. Cl.
*H05K 7/20* (2006.01)

(52) U.S. Cl.
USPC ............ 361/720; 361/704; 361/719; 174/252

(58) Field of Classification Search
None
See application file for complete search history.

(56) References Cited

U.S. PATENT DOCUMENTS

| | | | | |
|---|---|---|---|---|
| 5,467,251 A * | 11/1995 | Katchmar | ...................... | 361/719 |
| 5,475,263 A * | 12/1995 | Coady et al. | ................... | 257/700 |
| 5,708,566 A * | 1/1998 | Hunninghaus et al. | ........ | 361/704 |
| 5,978,223 A * | 11/1999 | Hamilton et al. | ............. | 361/704 |
| 6,212,071 B1 * | 4/2001 | Roessler et al. | .............. | 361/704 |
| 6,335,862 B1 * | 1/2002 | Koya | ............................. | 361/708 |
| 6,621,705 B1 | 9/2003 | Ballenger et al. | | |
| 6,770,967 B2 * | 8/2004 | Barcley | .......................... | 257/706 |
| 6,816,377 B2 * | 11/2004 | Itabashi et al. | ................ | 361/704 |
| 6,882,537 B2 * | 4/2005 | Barcley | .......................... | 361/719 |
| 7,054,159 B2 * | 5/2006 | Nakamura | ..................... | 361/719 |
| 8,383,946 B2 * | 2/2013 | Kim | .............................. | 174/252 |
| 8,391,010 B2 * | 3/2013 | Rothkopf et al. | ............. | 361/708 |
| 2012/0201008 A1 * | 8/2012 | Hershberger et al. | ......... | 361/720 |

FOREIGN PATENT DOCUMENTS

| | | |
|---|---|---|
| DE | 10029094 A1 | 12/2001 |
| EP | 0989794 A2 | 3/2000 |
| GB | 2259408 A | 3/1993 |

* cited by examiner

*Primary Examiner* — Boris Chervinsky
(74) *Attorney, Agent, or Firm* — The Webb Law Firm

(57) ABSTRACT

The invention relates to a method of cooling electronic circuit boards using surface mounted devices (SMD), the method comprising the steps of: after or during the board layout, filling empty spaces V1, V2, V3, V4, V5, V6, V7, V8, V9, V10 with at a number of heat sink devices 1, 2, 3, 4, 5 near a thermal hot spot and connecting the number of heat sink devices 1, 2, 3, 4, 5 to a thermally conducting path 25, 27, 29, 31, 33, 35 of the board N, respectively. Further, the invention relates to a heat sink device 1, 2, 3, 4, 5 adapted to implement the method according to the invention.

9 Claims, 10 Drawing Sheets

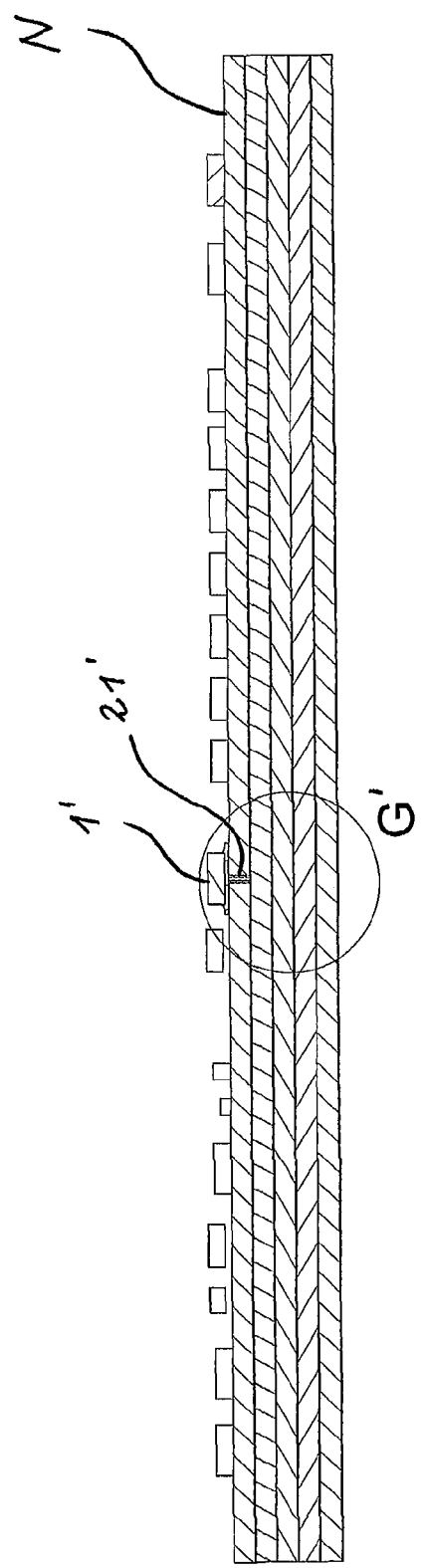

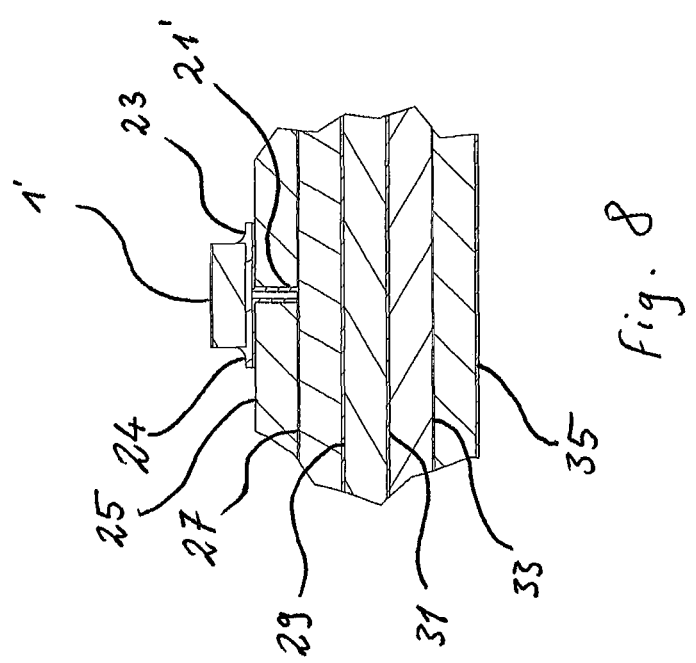

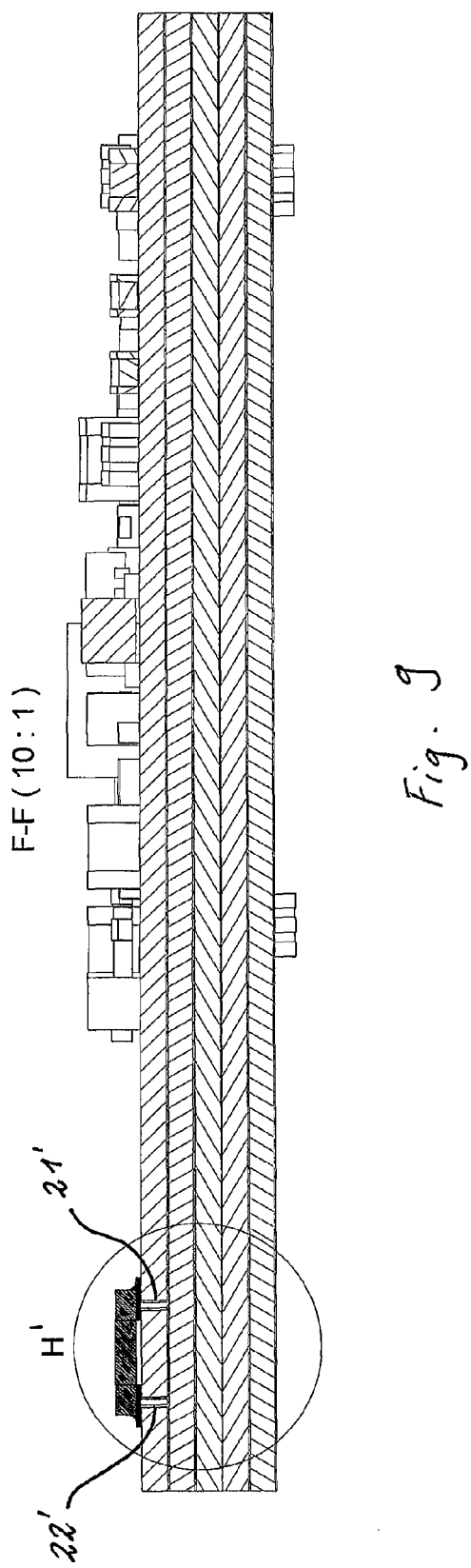

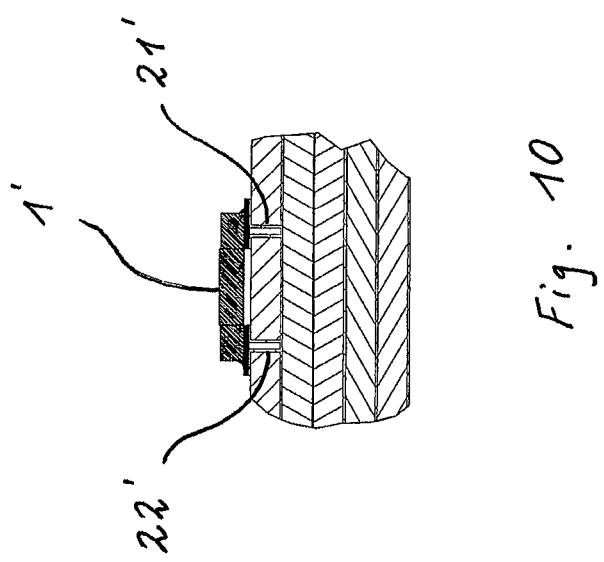

METHOD OF COOLING ELECTRONIC CIRCUIT BOARDS USING SURFACE MOUNTED DEVICES

BACKGROUND OF THE INVENTION

1. Field of the Invention

The invention relates to a method of cooling electronic circuit boards using surface mounted devices. Further, the invention relates to a heat sink device for cooling electronic circuit boards using surface mounted devices.

2. Description of Related Art

In most electronic circuit boards, temperature results from the electronic function of the board, or rather the electronically active parts on the board. Increased temperatures are in fact a main reason for defects of electronic devices.

Temperature-critical applications use lumped heat sinks to reduce the temperature of the electronic components. However, the space available on or around the components is limited in many cases.

A known method of cooling electronic circuit boards, which surface mounted devices are placed on, uses a fan to increase the airflow. Unfortunately, the increased airflow results in higher acoustic noise level and in increased energy costs. Another known method uses a heat sink or cooling unit placed on a surface mounted device, which produces heat (e.g. microprocessors) under operating conditions. This solution requires an additional mechanical production step with additional costs.

Another solution is to use a thermally conductive interface material between the thermal hot spot and a heat sink. This heat sink can be a lumped heat sink or the chassis of the equipment. A cooling area on the printed circuit board can be used as a heat sink, too. These solutions, however, require an additional mechanical production step with additional costs. The cooling results depend on the skills of the employee in the production flow.

If there are large unused areas on the printed circuit board, lumped heat sinks are the state of the art to cool the boards. Unfortunately, in many cases, this results in a certain distance between the hot spot and such lumped heat sink, which decreases the effect of dissipating heat from the board. Moreover, in many cases, the space available is limited and the use of a lumped heat sink is not possible.

However, in the layout of some boards, there is not even enough room or space on the board to place further fans or cooling units. Another known method is to use a copper or aluminum core inside the board. This solution is intended to spread the heat and to use a larger board area for cooling. Unfortunately, this solution is quite expensive and is not available from every board manufacturer.

It is therefore an object of the present invention to provide a method of cooling electronic circuit boards, on which surface mounted devices are placed or have to be placed. It is a further object of the invention to provide a heat sink device adapted to realize the method according to the invention.

SUMMARY OF THE INVENTION

The present invention enables electronic circuit boards to be cooled by using distributed small heat sink devices, which are placed or assembled to the board in the form of surface mounted devices (SMD). Since even small spaces on the board (both surfaces) can be filled with heat sink devices (small with dimensions in the range of millimeters, preferably parallelepiped-shaped), it is possible to place such a heat sink device close to a hot spot on the board. A number of heat sink devices, which are mounted directly on the board's surface, increase the effective surface of the board to dissipate heat to the surroundings (improving cooling performance). Since the at least one heat sink device is placed by SMD method, i.e. the device is directly soldered to the board, a good thermal contact between the board and said heat sink device exists.

The heat sink device according to the invention is defined (when placed on the board) as a non-electrical effective small device (connected to the board with no electrical functions or electrically passive) in contrast to SMD parts like resistors, capacitors, inductors, microprocessors, logical arrays, RAM chip, etc. Such small heat sink device(-s) (compared to lumped heat sink) can be placed near to a (thermal) hot spot on the board. In this manner, it is possible to improve the cooling efficiency, compared to other solutions which are placed remote from a hot spot.

According to an embodiment of the invention, the heat sink device can be a standard SMD part, like a resistor, inductor, particularly a capacitor. In this embodiment, the standard SMD part does not act as an electrically active resistor, inductor or capacitor. The advantage of using of a standard SMD part as a heat sink device consists in the low costs of these SMD parts (e.g. one-tenth of a cent for a high volume SMS resistor or SMD capacitor per part). Another preferred solution utilizes heat sink devices which are specially produced for the purpose of dissipating heat (away from the board). Since these devices can be optimized (in shape with larger effective surface and thermally conducting material, especially metal such as copper or aluminum) for their thermal (cooling) effect regardless of any electrical function, it is possible to raise the effect of dissipating heat to the surroundings.

However, after assembling the at least one heat sink device, it is connected to a thermally conducting path of the board. This path can also have an electrical function, but in case the at least one heat sink device is made of an electrically conducting material, it has to noted that it is assembled, e.g. soldered, without producing any (remarkable) electrical effect to the board or amending the board's electrical properties. To avoid such effect, it is e.g. possible to connect the at least one heat sink device only to one thermally and electrically conducting path of the board or to different paths which have no difference in voltage (electrical potential). In case the heat sink device is a standard SMD part, preferably a capacitor (because of its height and thus its larger thermally effective surface as compared to a resistor), only one pin or contact of the device is connected at all, or both (or more) pins are connected to only one path of the board or to different paths which have no difference in electrical potential.

In a preferred embodiment of the invention, such a thermally and electrically effective path of the board can be the path of the supply voltage (ground, plus, minus) of the board, which usually is the path with the largest (thermally effective) surface and is therefore more thermally effective than other paths.

In a preferred solution of the invention, the at least one heat sink device is assembled together with the functional SMD parts during a standard assembling process. Thus, the place (-s) for the at least one heat sink device on the board can already be planned during board layout or even after finalizing the complete board layout. In this manner, it is possible to save time and costs, and it is even possible according to the invention to refit or upgrade a board which has low thermal properties in dissipating heat (from the board to the surroundings). Furthermore, this lowers the risk of assembling defects.

As opposed to this, a lumped heat sink, as mentioned before, results in board design and layout constraints. Said lumped heat sink results in an area (or several areas) where it is not possible to place electronic components. Furthermore, said lumped heat sink has to be electrically isolated from the board in many cases. This results in additional costs and reduced cooling performances.

Since the heat sink device(-s) according to the invention can even be used after finalizing the complete board layout, the time to develop a new product is reduced without the additional layout constraints by lumped heat sinks.

According to the invention, a number of heat sink devices act as a distributed cooling device (heat sink), which solves the problem of lacking space for installing a lumped heat sink.

In a further embodiment of the invention, the at least one heat sink device is connected to heat conducting copper planes/paths on or inside the board. This increases the positive effect of dissipating heat away from the board.

In every embodiment of the invention, it is possible to place the heat sink device(-s) on any side, preferably on both sides of a (printed) electronic circuit board.

In the following, the invention will be described with reference to the embodiments apparent from the drawing. In the drawing, the Figures show:

BRIEF DESCRIPTION OF THE DRAWINGS

FIG. 7 a sectional view of FIG. 2 along line A-A with a microvia as a second embodiment of a connection to another layer than the top face;

FIG. 8 an enlarged view of detail G' in FIG. 7;

FIG. 9 a sectional view of FIG. 2 along line F-F with a microvia in the second embodiment of a connection to another layer than the top face; and FIG. 10 an enlarged view of detail H' in FIG. 9.

DESCRIPTION OF THE PREFERRED EMBODIMENT(S)

Figure 1:
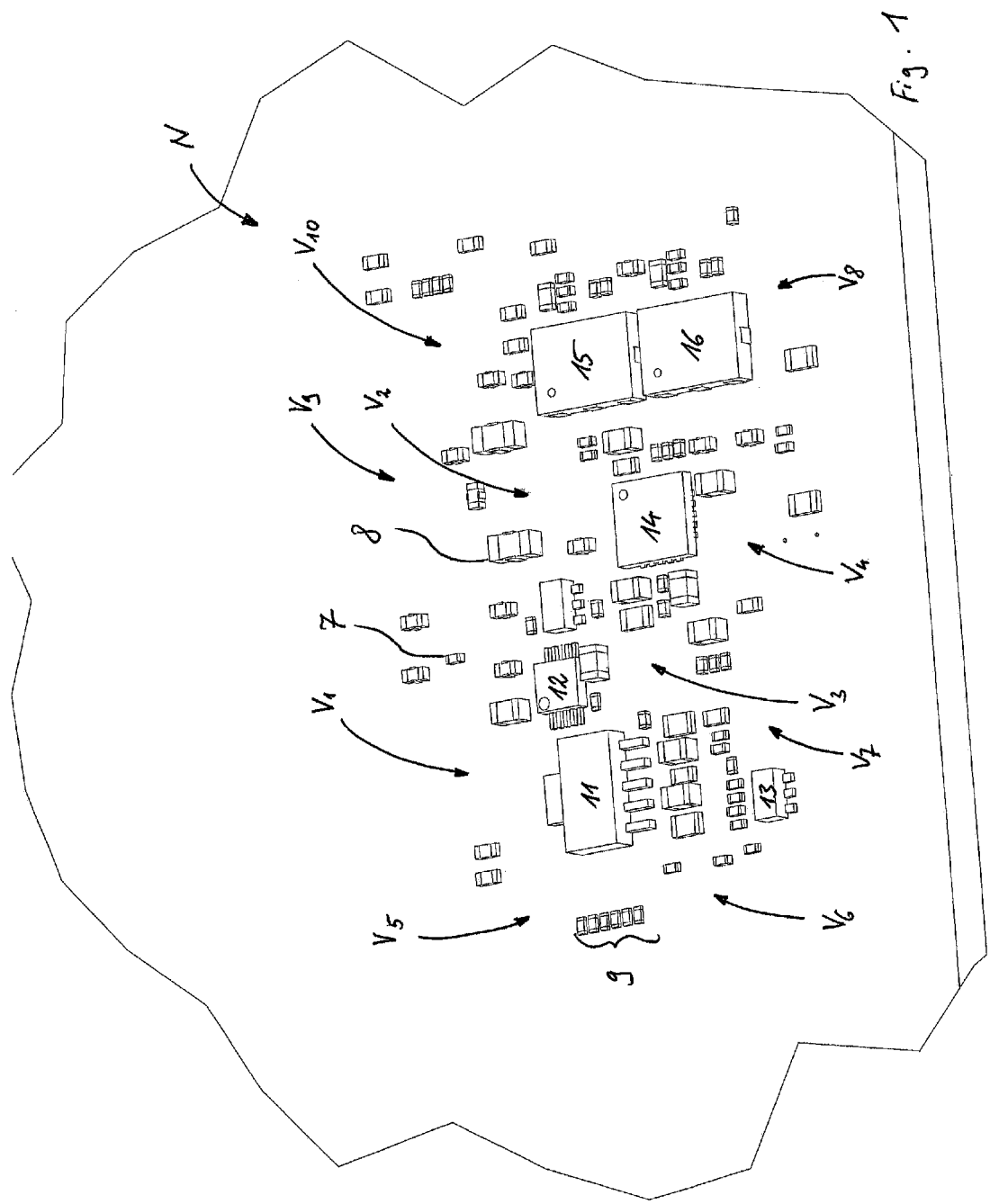
FIG. 1 a top view of a circuit board without heat sink devices.

FIG. 1 shows a printed circuit board comprising SMD elements (ICs 11, 12, 13, 15, 16, microprocessor 14, resistors 9, capacitors 7, 8 etc. in different sizes and types) assembled on the board. Between these elements and around them, there is some space $V_2, V_3, V_4$ (between these elements) and $V_1, V_5, V_6, V_7, V_8, V_9, V_{10}$ (around these elements) on the board, but too small to place a lumped heat sink on the board.

Elements placed on the board such as microprocessors 14, ICs 15, 16, power ICs 11, 12, 13 (e.g. for output signal amplifiers) and others, generate heat (hot spots) in a quantity which could be harmful to the electrical function of the printed circuit (by damaging the element itself, other elements or the structure of the board). Since the heat is also transported through the board, even other elements on the board or the board itself can be damaged.

It is therefore necessary to dissipate or remove the heat produced, which is usually done by circulated air (air flow) produced by a fan.

Because of the noise resulting from producing an air circulation sufficient for cooling the electronic equipment, it is desirable in some cases to reduce the noise without reducing the effect of cooling or with even improving the effect of cooling.

Figure 2:
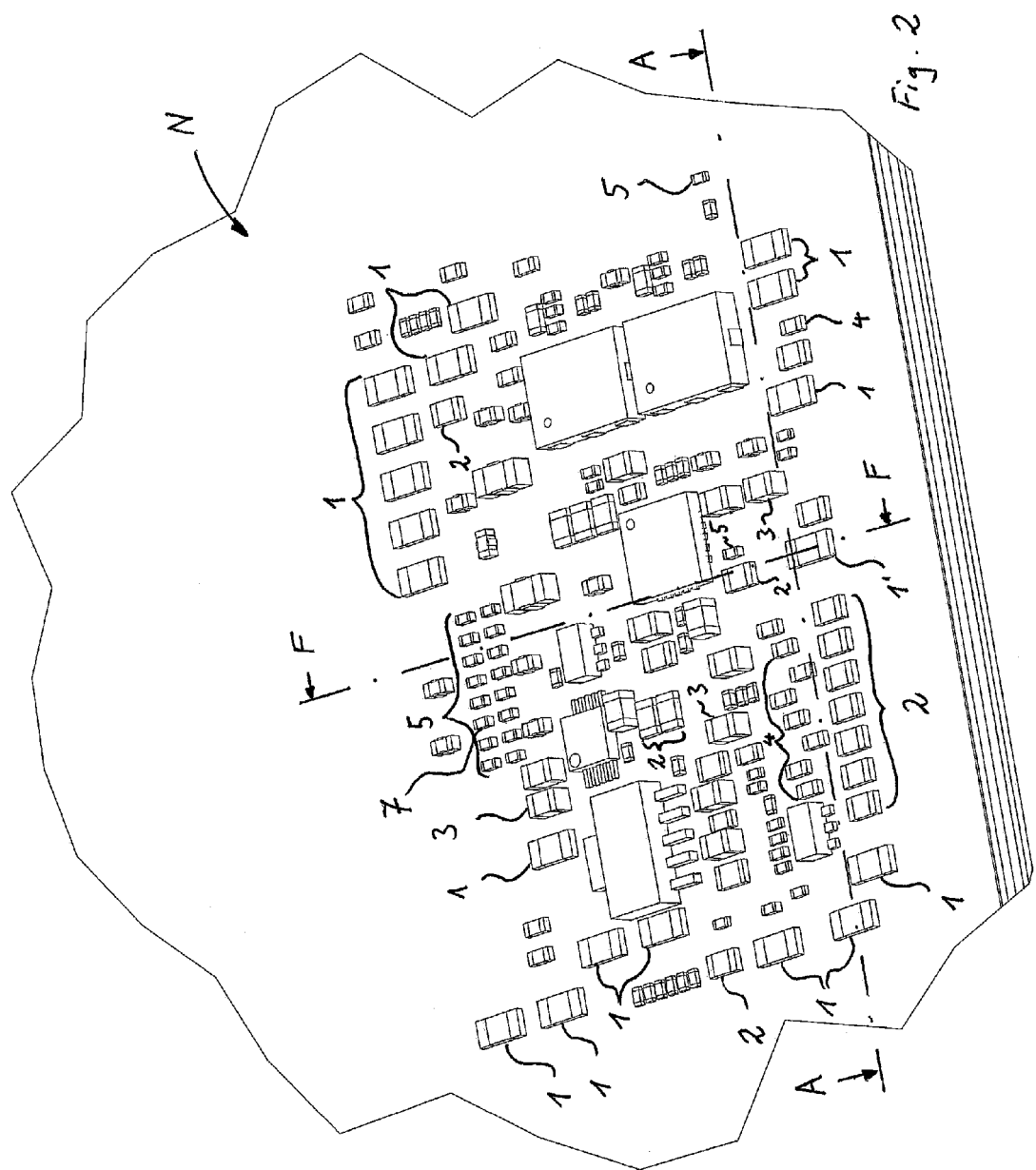
FIG. 2 a top view of a circuit board with heat sink devices according to the invention (placed on it)
Figure 3:
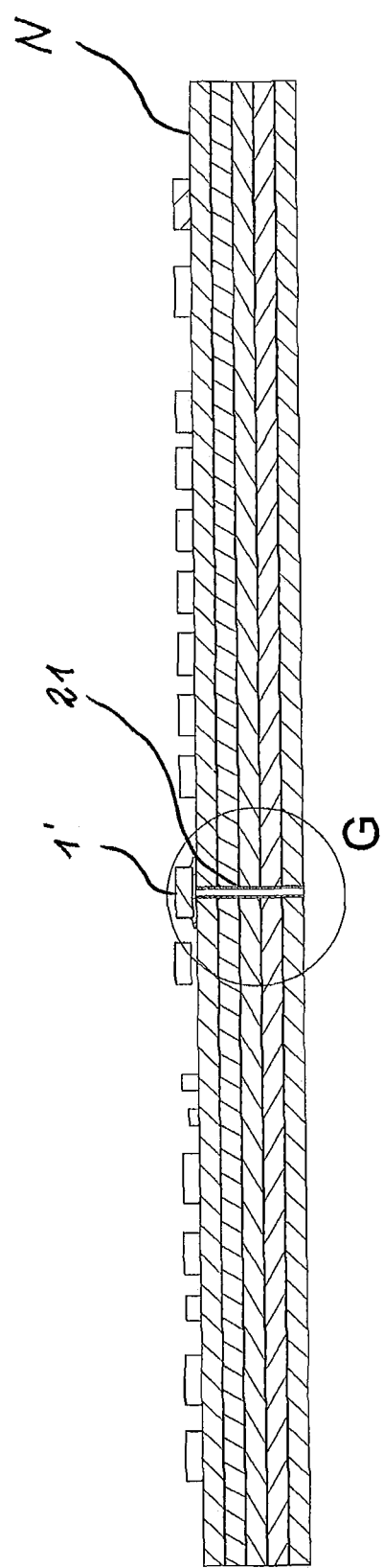
FIG. 3 a sectional view of FIG. 2 along line A-A with a through hole as a first embodiment of a connection to other layers than the top face.
Figure 4:
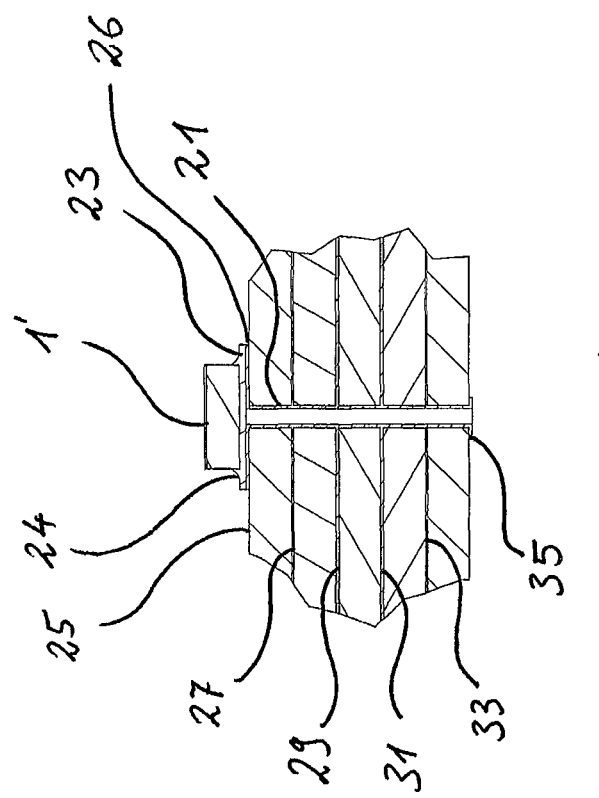
FIG. 4 an enlarged view of detail G in FIG. 3.
Figure 5:
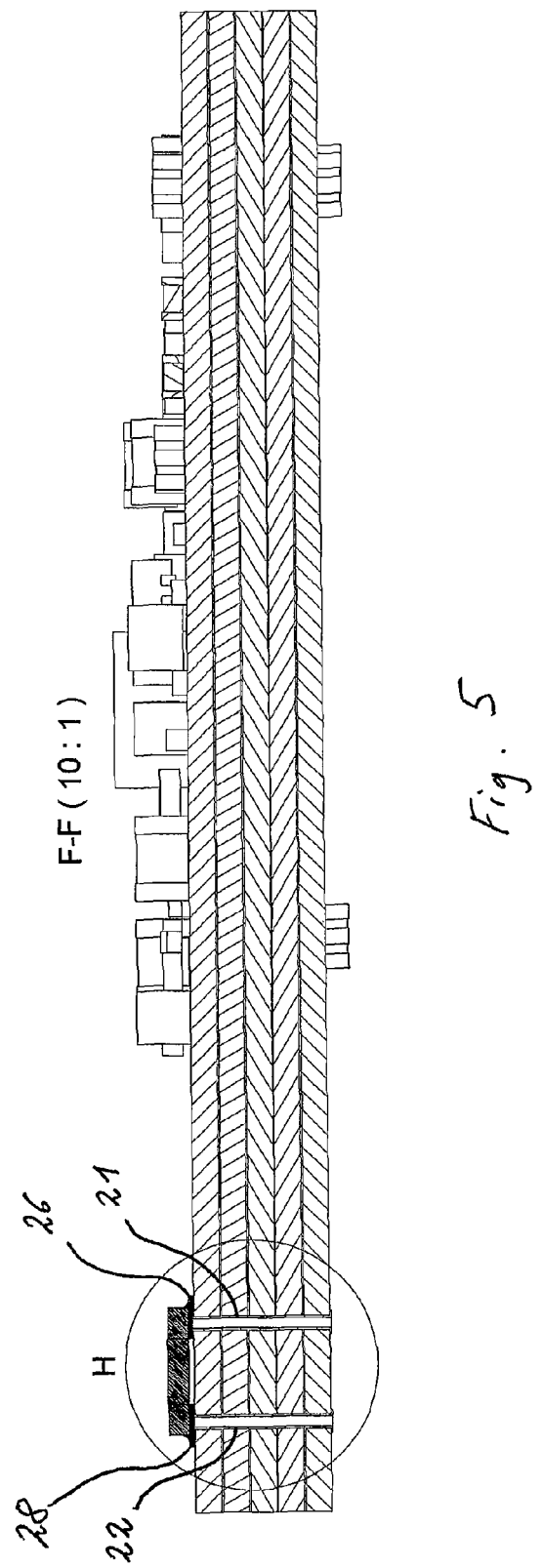
FIG. 5 a sectional view of FIG. 2 along line F-F.
Figure 6:
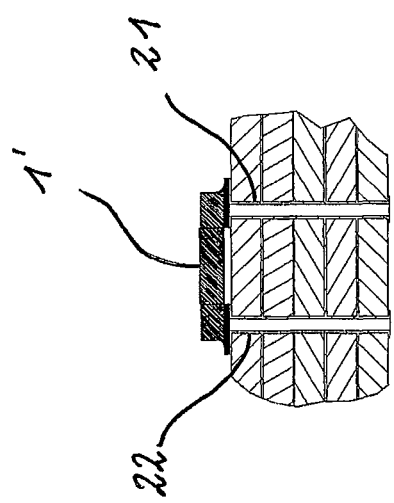
FIG. 6 an enlarged view of detail H in FIG. 5.

FIG. 2 shows the board of FIG. 1, where the typically existing free spaces $V_1, V_2, V_3, V_4, V_5$ and $V_6, V_7, V_8, V_9, V_{10}$ are used to be filled (assembled) with a number of heat sink devices 1, 2, 3, 4, 5. Said heat sink devices 1, 2, 3, 4, 5, which are assembled automatically by surface mounting machines, can vary in size, depending on the available free space at the respective position on the board and/or depending on the available size and position of the solder pads on the board.

As can be seen from FIG. 2, even in very small free space or places of the board very small heat sink devices 5 can be placed, whereas in other, somewhat larger places small (but somewhat larger) heat sink devices 4 can be placed, which are a little larger than the aforesaid devices. Furthermore, in even larger places, some (even larger) medium-sized heat sink devices 2 can be placed, and the largest devices 1 are placed in the largest free places on the board. Another (differently shaped) heat sink device 3 shows an example of a heat sink device with a larger height than the aforesaid devices.

The heat sink devices 1, 2, 3, 4, 5 are adapted to receive or absorb heat from the board through their area of contact/contact surface (area of soldering and bottom side) and dissipate the heat by their thermally effective surfaces to the surroundings (air flow generated by a fan, etc.).

As heat sink devices 1, 2, 3, 4, 5, standard SMD parts/elements like resistors, inductors and particularly capacitors (because of their larger height and thus larger surface) can be used. Suitable SMD elements and different sizes/types are well-known and shall not be further discussed within this description. Such SMD elements, particularly SMD capacitors, acting as heat sink devices are available at reasonably low costs, as such devices are produced in high numbers. In this way, matching standard SMD elements can easily be chosen, particularly after the printed circuit layout (with its electrical functions) is done, out of different sizes and types (with their thermally effective surfaces). It is further within the scope of the invention to use a number of heat sink devices, even different in size, each having a thermally effective surface larger than the place (because of their height) covered by it, to improve the cooling performance.

In this way, a number of standard SMD elements, which are not contacted to the board to have any electrical function, may be used as a number of heat sink devices and may be distributed over the board in small free spaces accordingly acting as a distributed heat sink.

In case there are unused solder pads or areas (after the board layout is made), i.e. if these solder pads are not connected to the electrical paths of the board, both connecting surfaces/areas of the heat sink device can be soldered to the board for optimum thermal contact.

In case the contact surfaces are connected to the electrical paths of the board layout (electrical circuit), it is possible to solder only one contact surface of the heat sink device or to place the heat sink device in such a way that both contact surfaces are soldered to one electrical path without any potential difference, particularly to the ground.

Due to the physical properties of the material of the heat sink device(-s) and due to the thermally effective surface of said devices (enhanced thermally effective surface), the performance of dissipating heat from the board is improved.

It is thus no longer necessary to enhance the air flow or to choose other expensive solutions to improve the cooling performance.

Of course, the heat sink devices may also be specially produced parts, particularly cuboid blocks, made of heat conducting material, preferably aluminum or copper. Thus, it is possible to optimize the size and therefore the thermally effective surface conducting heat from the board to the heat sink device and from it to the circumfluent air dissipating/removing the heat from the board. Such parts can be produced with even lower costs than standard SMD elements Typical sizes (length, width, height) of a heat sink device can vary from less than one to a few millimeters, e.g. length 1-2 mm, width 0.2-0.9 mm and height 0.5-1 mm.

The board layout may further comprise a layer/plane of copper (not shown) for better cooling of the board. In this case, the heat sink device(-s) can be contacted to this plane to further improve the cooling performance.

As can be seen from the sectional view shown in FIG. 3, FIG. 4 and FIG. 7, FIG. 8, by soldering a heat sink device 1' (as an example of connections to the board N for all heat sink devices 1, 2, 3, 4, 5) by an SMD assembling process, there is a direct and short way (immediate) material contact resulting in a good heat-conducting connection from the board to the heat sink device dissipating heat from the board. The heat sink device 1' is soldered to solder pads 26 and 28 on a top face 25 of the printed circuit board N including solder menisci 23 and 24.

In a first embodiment shown in FIG. 3 to FIG. 6, the solder pads 26, 28 are also (thermally) connected to a first 27, second 29, third 31, fourth 33 and bottom layer 35 by means of through holes 21 and 22.

In a second embodiment shown in FIG. 7 to FIG. 10 (as an example of being connected to one or more layers), the solder pads 26, 28 are only (thermally) connected to the first layer 27 by means of microvias 21' and 22' without any connection to the other layers 29, 31, 33 and 35.

Of course, the heat sink device 1' can be connected via solder pads 26, 28 to circuits on the top face in both embodiments only or to any combination of layers as required or possible during the layout of the board.

The heat sink devices 1, 2, 3, 4, 5 distributed on the printed circuit board N filling free spaces (places in the board layout without any electrically functional SMD device) act as a distributed heat sink cooling the board. Therefore, the heat sink devices are connected to one layer, particulary the top face 25 or to any combination of layers 25, 27, 29, 31, 33 and 35 of the board N.

In this way, it is possible to improve the cooling performance of the board without increasing the usual air flow by means of more powerful fans or without using or enlarging other means including their disadvantages (noise, power consumption, etc.).

Since the heat sink devices (standard SMD elements or specially produced parts or a combination thereof) can be placed by standard surface mounting technology, it is possible to plan the filling of free spaces using any combination of differently sized and shaped heat sink devices during the layout of the printed circuit board N, particularly after finishing the step of the layout for electrically functional SMD devices on the board.

In this way, there is no remarkable disadvantage in time for producing the board using standard surface mounting technology by placing electrically functional SMD elements together with the heat sink devices.

The correct assembling of the (distributed) heat sink devices can be tested (particularly together with the test for the electrically functional SMD devices) by using an automatic optical inspection (AOI) system, which is a standard test procedure for assembled printed circuit boards.

Of course, distributed heat sink devices, as shown above for the top face, can be used on both sides (top and/or bottom) of a printed circuit board in many cases. In case there is little headroom at the bottom board side, the heat sink devices can be embodied as low profile variants. Even if the thermally effective surface is not much larger than the space covered, the heat sink device can have a better cooling performance because of its better heat conducting properties (as compared to the surface of the board).

List of Reference Signs
    1 largest heat sink devices
    1' largest heat sink device for detail views
    2 medium-sized heat sink devices
    3 heat sink devices with a larger height
    4 small heat sink devices
    5 very small heat sink devices
    7 SMD capacitor
    9 SMD resistor
    11, 12, 13 power ICs
    14 microprocessor
    15, 16 ICs
    21, 22 through holes
    21', 22' microvias
    23, 24 solder meniscus
    25 top of pcb (surface layer)
    26 solder pad
    27 first layer
    28 solder pad
    29 second layer
    31 third layer
    33 fourth layer
    35 bottom of pcb (bottom layer)
    N PCB (printed circuit board)
    A-A cutting line
    F-F cutting line
    G detail
    H detail
    G' detail
    H' detail
    $V_2, V_3, V_4$ free spaces between the elements
    $V_1, V_5, V_6, V_7,$ free spaces around the elements
    $V_8, V_9, V_{10}$

The invention claimed is:

1. A method of cooling electronic printed circuit boards using surface mounted devices (SMD), the method comprising the steps of:
(a) after or during layout of the printed circuit board, filling empty spaces ($V_1, V_2, V_3, V_4, V_5, V_6, V_7, V_8, V_9, V_{10}$) on a top surface of the printed circuit board where functional SMD parts of the printed circuit board are not present with a number of heat sink surface mounted devices near a thermal hot spot by mounting the heat sink devices to the top surface of the printed circuit board, and
(b) connecting the number of heat sink surface mounted devices to a thermally conducting path of the printed circuit board, respectively.

2. The method of claim 1, wherein the number of heat sink surface mounted devices are assembled along with the functional SMD parts.

3. The method of claim 1, wherein the number of heat sink surface mounted devices are connected to heat conducting copper planes or paths on or inside the printed circuit board.

4. The method of claim 1, wherein the number of heat sink surface mounted devices are assembled to the board to form a distributed heat sink around the printed circuit board.

5. The method of claim 1, wherein the number of heat sink surface mounted devices are assembled on both sides of the printed circuit board.

6. The method of claim 1, wherein standard SMD parts are used as at least one of the heat sink surface mounted devices.

7. The method of claim 1, wherein at least one of the heat sink surface mounted devices is made of thermally conducting material.

8. A heat sink device adapted to realize the method of claim 1, wherein the heat sink surface mounted device is made of thermally conducting material and has a length less than 10 mm, width less than 10 mm and height less than 5 mm.

9. The layout of an electronic circuit board using surface mounted devices (SMD) adapted to realize the method of claim 1, wherein empty spaces ($V_1, V_2, V_3, V_4, V_5, V_6, V_7, V_8, V_9, V_{10}$) are filled with a number of heat sink surface mounted devices near a thermal hot spot.

* * * * *